United States Patent
Hsieh et al.

(10) Patent No.: US 12,362,154 B2
(45) Date of Patent: Jul. 15, 2025

(54) ION BEAM ETCHING CHAMBER WITH ETCHING BY-PRODUCT REDISTRIBUTOR

(71) Applicant: Taiwan Semiconductor Manufacturing Company, Ltd., Hsin-Chu (TW)

(72) Inventors: Te-Hsien Hsieh, Kaohsiung (TW); Lee-Chuan Tseng, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 112 days.

(21) Appl. No.: 17/586,484

(22) Filed: Jan. 27, 2022

(65) Prior Publication Data
US 2022/0148856 A1    May 12, 2022

Related U.S. Application Data

(62) Division of application No. 15/991,029, filed on May 29, 2018, now Pat. No. 11,239,060.

(51) Int. Cl.
*H01J 37/32* (2006.01)
*C23C 14/02* (2006.01)
(Continued)

(52) U.S. Cl.
CPC ...... *H01J 37/32633* (2013.01); *C23C 14/022* (2013.01); *C23C 14/46* (2013.01);
(Continued)

(58) Field of Classification Search
CPC ... C23C 14/022; C23C 14/46; C23C 14/5873; C23C 16/0245; H01J 37/32633;
(Continued)

(56) References Cited

U.S. PATENT DOCUMENTS 5,834,371 A   11/1998   Ameen et al.
6,110,844 A * 8/2000   Rader .................. C23C 14/564
                                                257/E21.252
(Continued)

FOREIGN PATENT DOCUMENTS

CN   102856151 A  *  1/2013
CN   202830164 U     3/2013
(Continued)

OTHER PUBLICATIONS

Chiang et al. (CN-102856151-A) English Machine Translation retrieved from ESPACENET Sep. 12, 2023 (Year: 2023).*
(Continued)

*Primary Examiner* — Ram N Kackar
*Assistant Examiner* — Laureen Chan
(74) *Attorney, Agent, or Firm* — Eschweiler & Potashnik, LLC

(57) ABSTRACT

In some embodiments, the present disclosure relates to an etching apparatus. The etching apparatus includes a substrate holder disposed within a processing chamber and having a workpiece reception surface configured to hold a workpiece. A lower surface of the processing chamber has a first region that is directly below the workpiece reception surface and that is configured to receive a byproduct from an etching process. A baffle extends outward from a sidewall of the processing chamber at a vertical position between the substrate holder and the lower surface of the processing chamber. The baffle covers a second region of the lower surface. A byproduct redistributor is configured to move the byproduct from the first region of the lower surface to the second region of the lower surface that is directly below the baffle.

20 Claims, 7 Drawing Sheets

(51) Int. Cl.

| | |
|---|---|
| *C23C 14/46* | (2006.01) |
| *C23C 14/56* | (2006.01) |
| *C23C 14/58* | (2006.01) |
| *C23C 16/02* | (2006.01) |
| *C23C 16/44* | (2006.01) |
| *H01L 21/3065* | (2006.01) |
| *H01L 21/311* | (2006.01) |
| *H01L 21/3213* | (2006.01) |
| *H01L 21/687* | (2006.01) |

(52) U.S. Cl.
CPC ...... *C23C 14/5873* (2013.01); *C23C 16/0245* (2013.01); *H01J 37/32422* (2013.01); *H01J 37/32431* (2013.01); *H01J 37/32449* (2013.01); *H01J 37/32522* (2013.01); *H01J 37/32715* (2013.01); *H01J 37/32834* (2013.01); *H01J 37/32871* (2013.01); *H01L 21/3065* (2013.01); *H01L 21/31116* (2013.01); *H01L 21/32136* (2013.01); *H01L 21/68785* (2013.01); *C23C 14/564* (2013.01); *C23C 16/4412* (2013.01); *H01J 2237/022* (2013.01); *H01J 2237/334* (2013.01)

(58) Field of Classification Search
CPC ........... H01J 37/32412; H01J 37/32477; H01J 37/32495; H01J 37/32504
See application file for complete search history.

(56) References Cited

U.S. PATENT DOCUMENTS

| | | | |
|---|---|---|---|
| 2002/0016079 A1 | 2/2002 | Dykstra et al. | |
| 2005/0016462 A1* | 1/2005 | Yamazaki | C23C 14/5806 427/255.6 |
| 2005/0020070 A1 | 1/2005 | Ichiki et al. | |
| 2005/0093012 A1* | 5/2005 | Bailey, III | B08B 7/0035 257/E21.311 |
| 2005/0211264 A1 | 9/2005 | Kostenko et al. | |
| 2005/0224180 A1* | 10/2005 | Bera | H01J 37/3244 156/345.33 |
| 2007/0234960 A1 | 10/2007 | Honda et al. | |
| 2007/0281106 A1 | 12/2007 | Lubomirsky et al. | |
| 2009/0178763 A1 | 7/2009 | Carducci et al. | |
| 2009/0188625 A1* | 7/2009 | Carducci | H01J 37/32467 156/345.1 |
| 2010/0175622 A1 | 7/2010 | Yoon et al. | |
| 2011/0042009 A1 | 2/2011 | Lee et al. | |
| 2012/0145535 A1 | 6/2012 | Kamiya et al. | |
| 2012/0285621 A1 | 11/2012 | Tan | |
| 2013/0137273 A1* | 5/2013 | Engelhardt | H01L 21/6838 118/728 |
| 2013/0327480 A1 | 12/2013 | Carducci et al. | |
| 2014/0051253 A1 | 2/2014 | Guha | |
| 2015/0059981 A1* | 3/2015 | Huston | C23C 16/46 118/733 |
| 2015/0243486 A1 | 8/2015 | Yokogawa et al. | |
| 2016/0002784 A1 | 1/2016 | Omstead | |
| 2016/0035541 A1 | 2/2016 | Kozuka et al. | |
| 2016/0071722 A1 | 3/2016 | Miura et al. | |
| 2016/0155614 A1 | 6/2016 | Kim et al. | |
| 2016/0189925 A1 | 6/2016 | Kamiya et al. | |
| 2018/0197719 A1* | 7/2018 | Lee | H01J 37/3435 |
| 2019/0122868 A1* | 4/2019 | Yamashita | H01J 37/32633 |
| 2019/0148109 A1* | 5/2019 | Yun | H01L 21/67069 156/345.55 |

FOREIGN PATENT DOCUMENTS

| | | | |
|---|---|---|---|
| CN | 106191809 A | | 12/2016 |
| CN | 106935530 A | | 7/2017 |
| JP | 2004327543 A | * | 11/2004 |
| JP | 2011243732 A | | 12/2011 |
| WO | 9950886 A1 | | 10/1999 |
| WO | 2014137905 A2 | | 9/2014 |

OTHER PUBLICATIONS

English Machine Translation of JP2004327543A retrieved from ESPACENET Sep. 17, 2024 (Year: 2024).*
"About the Ion Milling Process." Ion Beam Milling, Inc. Retrieved online on Apr. 5, 2018 from http://www.ionbeammilling.com/about_the_ion_milling_process.
"Ion Beam Etcher Nexus IBE350 from Veeco." Retrieved online on Apr. 5, 2018 from https://cmi.epfl.ch/etch/IBE350.html.
Stauss, et al. "MicroFab: The Cutting Edge of Ion Beam Etch and Thin Film Technology." Retrieved online on Apr. 5, 2018 from http://www.microfabnh.com/ion_beam_etch_technology.php.
"Ion Beam Etching." Oxford Instruments. Retrived online on Apr. 5, 2018 from https://www.azom.com/article.aspx?ArticleID=7533.
Non-Final Office Action dated Jun. 8, 2020 for U.S. Appl. No. 15/991,029.
Final Office Action dated Nov. 18, 2020 for U.S. Appl. No. 15/991,029.
Non-Final Office Action dated Apr. 16, 2021 for U.S. Appl. No. 15/991,029.
Notice of Allowance dated Sep. 14, 2021 for U.S. Appl. No. 15/991,029.
Notice of Allowance dated May 28, 2025 for U.S. Appl. No. 18/357,370.

* cited by examiner

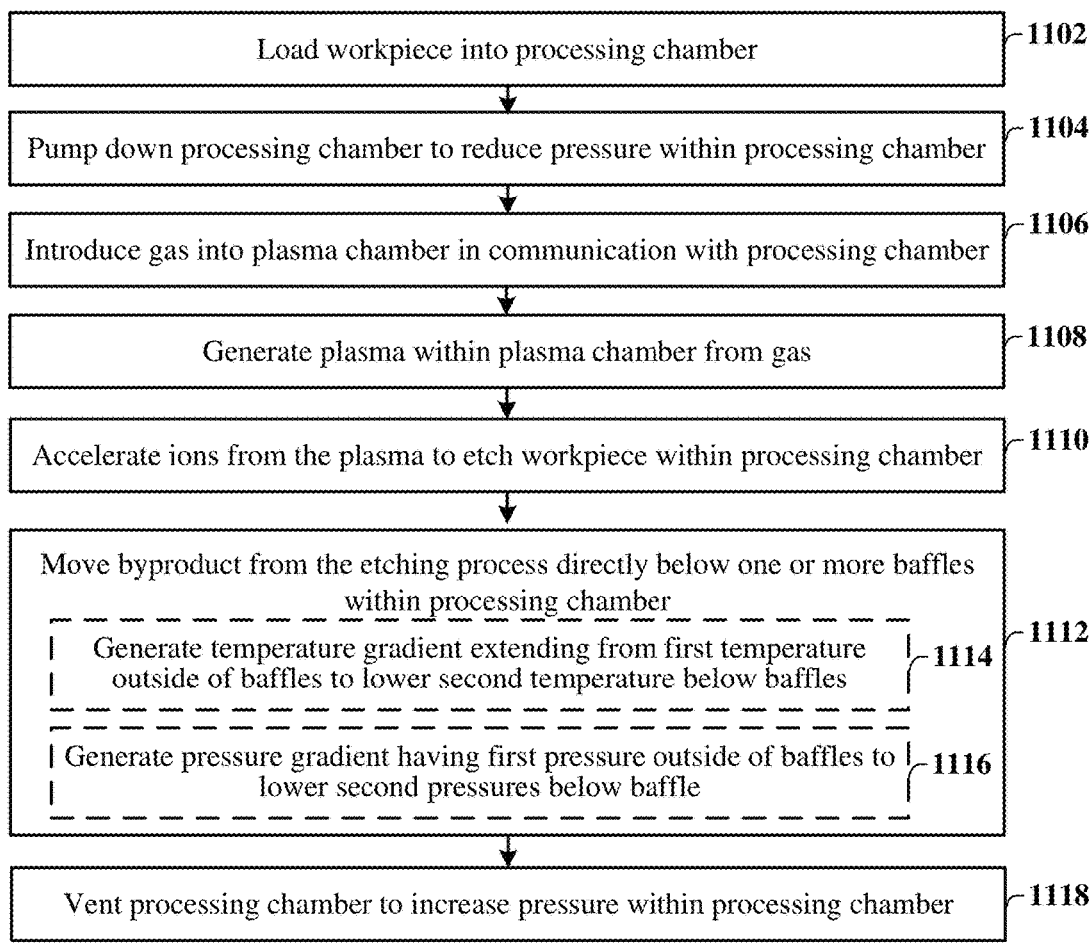

ION BEAM ETCHING CHAMBER WITH ETCHING BY-PRODUCT REDISTRIBUTOR

REFERENCE TO RELATED APPLICATION

This application is a Divisional of U.S. application Ser. No. 15/991,029, filed on May 29, 2018, the contents of which are hereby incorporated by reference in their entirety.

BACKGROUND

Ion beam etching (i.e., ion beam milling) is a commonly used etching process used during the fabrication of integrated chips. Ion beam etching is an anisotropic etching process that is able to preferentially remove a material in a specific direction. By removing a material in a specific direction, high density features can be formed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 11 illustrates a flow diagram of some embodiments of a method d of performing an ion beam etching process.

DETAILED DESCRIPTION

Figure 1:
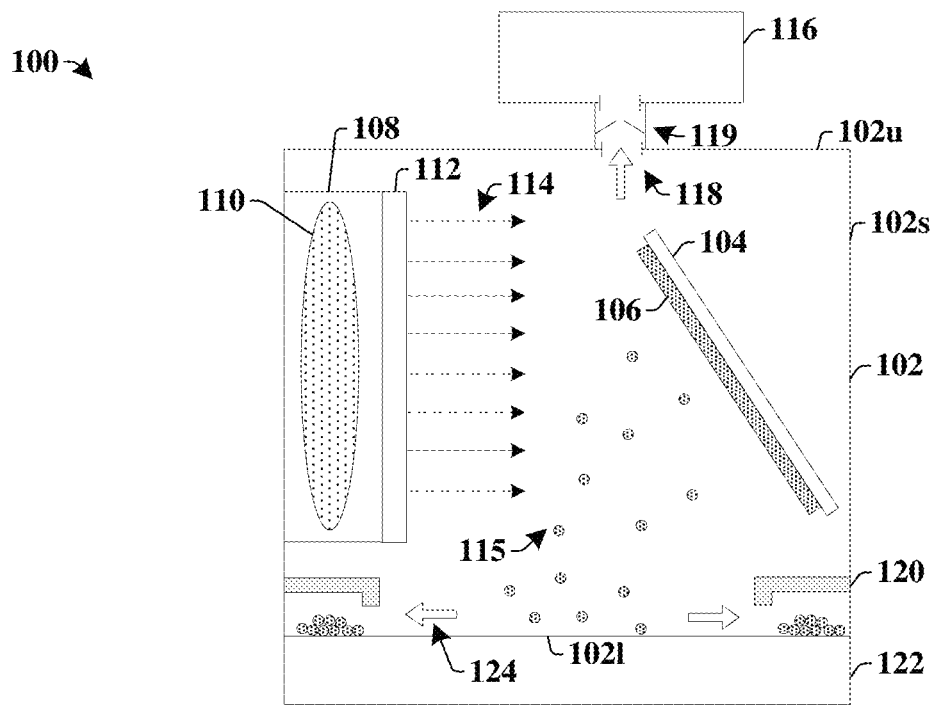
FIG. 1 illustrates a block diagram of some embodiments of a disclosed ion beam etching apparatus having one or more baffles configured to reduce re-deposition of an etching by-product onto a workpiece.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Ion beam etching is a dry etching process that etches a material on a workpiece by bombarding the material with an ion beam comprising charged ions. To perform ion beam etching, a workpiece is loaded into a processing chamber and the processing chamber is pumped down to a high vacuum (i.e. a low pressure). A plasma is formed within a plasma source in communication with the processing chamber and an ion beam is then generated by acting on the plasma with an electric field that accelerates ions from the plasma towards the workpiece. When the charged ions strike the material with a sufficient energy they will dislodge particles of the material, thereby etching the material.

Particles that are dislodged from the workpiece by an ion beam etching process generally adhere to interior surfaces (e.g., sidewalls, a floor, and/or ceiling) of a processing chamber. However, some materials, such as ceramics (e.g., piezoelectric materials) do not adhere well to the interior surfaces of the processing chamber. It has been appreciated that when a processing chamber is vented (i.e., returned from low pressure to an ambient pressure after an etching process is completed), gases within the processing chamber can become turbulent and cause such particles to become airborne. The airborne particles can be re-deposited onto the workpiece causing reliability problems and reducing yield of an integrated chip on the workpiece. For example, the re-deposition of a conductive by-product onto an integrated chip workpiece may lead to electrical shorting and integrated chip failure.

The present disclosure, in some embodiments, relates to an ion beam etching apparatus that is configured to reduce re-deposition of an etching by-product onto a workpiece. The ion beam etching apparatus comprises a substrate holder disposed within a processing chamber and configured to hold a workpiece. The processing chamber is in communication with a plasma source configured to provide ions that are accelerated towards the substrate holder as an ion beam, and with a vacuum pump configured to reduce a pressure within the processing chamber. One or more baffles are arranged between the substrate holder and a lower surface of the processing chamber. A by-product redistributor is configured to move a by-product from an etching process from outside of the one or more baffles to directly below the one or more baffles. By moving the by-product from the etching process to directly below the one or more baffles, the one or more baffles are able to mitigate re-deposition of the by-product from the etching process back onto the workpiece, thereby decreasing defects on the workpiece and increasing yield.

FIG. 1 illustrates a block diagram of some embodiments of a disclosed ion beam etching apparatus 100 having one or more baffles configured to reduce re-deposition of an etching by-product onto a workpiece.

The ion beam etching apparatus 100 comprises a substrate holder 104 arranged within a processing chamber 102. The processing chamber 102 has a housing comprising a sidewall 102s arranged between an upper surface 102u and a lower surface 102l. The substrate holder 104 is configured to hold a workpiece 106 (e.g., comprising a semiconductor substrate) that is to be etched. The processing chamber 102 is in communication with a plasma source 108 that is configured to generate a plasma 110. In various embodiments, the plasma source 108 may comprise an inductively coupled plasma (ICP) source, a direct current plasma (DCP) source, a microwave-induced plasma (MIP) source, or the like.

A grid system 112 is arranged between the plasma source 108 and the substrate holder 104. The grid system 112 is configured to form an ion beam 114 by generating an electromagnetic field within the processing chamber 102. The electromagnetic field accelerates ions from the plasma 110 into the processing chamber 102 in a direction of the substrate holder 104. The ion beam 114 is configured to bombard a surface of the workpiece 106. Ions that impact the surface of the workpiece 106 with a sufficient energy will perform an etching process by dislodging particles from the workpiece 106. The dislodged particles fall towards the lower surface 102l of the processing chamber 102 as a by-product of the etching process.

The processing chamber 102 is coupled to a vacuum pump 116 by way of a vacuum inlet 118. In some embodiments, the vacuum inlet 118 may be within the upper surface 102u of the processing chamber 102. In other embodiments, the vacuum inlet 118 may be within other surfaces (e.g., the sidewall 102s) of the processing chamber 102. The vacuum pump 116 is configured to reduce a pressure within the processing chamber 102 during operation. Reducing a pressure within the processing chamber 102 allows for formation of the ion beam 114 and reduces contamination of the workpiece 106 during the etching process. In various embodiments, the vacuum pump 116 may comprise a roughing pump and/or a high vacuum pump. In some embodiments, a first valve 119 may be configured to selectively allow the vacuum pump 116 to pump down the processing chamber 102.

One or more baffles 120 are arranged along a perimeter of the processing chamber 102. The one or more baffles 120 are arranged at a vertical position that is below the substrate holder 104. In some embodiments, the one or more baffles 120 are arranged at a vertical position that is between the substrate holder 104 and a lower surface 102l of the processing chamber 102. In some embodiments, the one or more baffles 120 laterally extend over a part of the lower surface 102l of the processing chamber 102 and are separated from the lower surface 102l of the processing chamber 102 by a non-zero distance. In some embodiments, the one or more baffles 120 comprise sidewalls that are separated by a space that is directly below the substrate holder 104. In some embodiments, the one or more baffles 120 may be coupled to the sidewall 102s of the processing chamber 102. In other embodiments (not shown), the one or more baffles 120 may be coupled to the lower surface 102l of the processing chamber 102.

A by-product redistributor 122 is configured to redistribute (shown by arrows 124) the by-product 115 of the etching process from outside of (i.e., not directly below) the one or more baffles 120 to directly below the one or more baffles 120. By operating the by-product redistributor 122 to redistribute the by-product 115 of the etching process from outside of the one or more baffles 120 to directly below the one or more baffles 120, the one or more baffles 120 are able to prevent the by-product 115 of the etching process from being re-deposited on the workpiece 106 when the chamber is vented (i.e., returned from low pressure to an ambient pressure after the etching process is completed), thereby improving reducing defects on the workpiece 106 and increasing yield.

Figure 2:
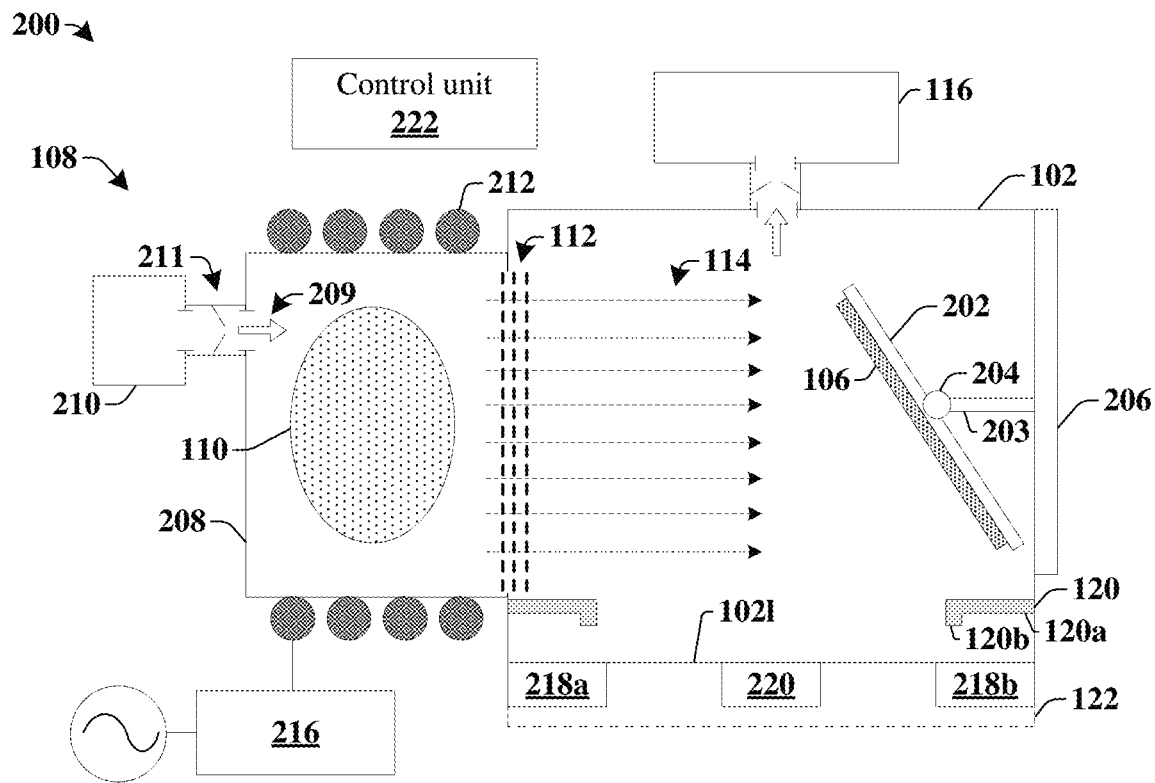
FIG. 2 illustrates a block diagram of some additional embodiments of a disclosed ion beam etching apparatus having one or more baffles.

FIG. 2 illustrates a block diagram of some additional embodiments of a disclosed ion beam etching apparatus 200 having one or more baffles.

The ion beam etching apparatus 200 includes a processing chamber 102 comprising a housing having sidewalls coupled between an upper surface and a lower surface 102l. In some embodiments, the housing may comprise a metal, such as aluminum, iron, or the like. A rotatable stage assembly 202 is disposed within the processing chamber 102. The rotatable stage assembly 202 comprises a workpiece reception area having a flat surface configured to receive a workpiece 106. The workpiece reception area is coupled to a mounting arm 203 by a joint 204 that is configured to rotate about one or more axes of rotation, so as to control an angle at which an ion beam 114 is able to strike the workpiece 106. In some embodiments, the rotatable stage assembly 202 may be configured to rotate so as to enable the ion beam 114 to strike the workpiece 106 at an angle of between +/−90 degrees. In some embodiments, the rotatable stage assembly 202 may be coupled to a chamber door 206 that is attached to the processing chamber 102 by one or more hinges configured to enable the chamber door 206 to swing open during loading of workpieces into the processing chamber 102

A plasma source 108 is coupled to the processing chamber 102. In some embodiments, the plasma source 108 comprises a plasma chamber 208 having a housing. The plasma chamber 208 is coupled to a gas source 210 (e.g., gas tank) by way of a gas inlet 209 arranged within an interior surface of the plasma chamber 208. In some embodiments, a second valve 211 may be configured to selectively allow the gas source 210 to introduce a gas into the plasma chamber 208. An RF antenna 212 is in communication with the plasma chamber 208. The RF antenna 212 is coupled to an RF power supply 214 configured to generate an RF signal. In some embodiments, the RF power supply 214 may operate at a set RF frequency (e.g., 13.56 MHz). In some embodiments, the RF power supply 214 may be coupled to the RF antenna 212 by way of a matching network 216 that is configured to match the output impedance of the RF power supply 214 to a complex impedance established by the RF antenna 212 and a plasma load (i.e., impedance), thereby efficiently coupling power from the RF power supply 214 into a plasma 110 within the plasma chamber 208.

In some embodiments, the RF antenna 212 may comprise a conductive coil comprising a conductive wire. In one embodiment, the conductive coil may be wrapped around an exterior of the plasma chamber 208 for a plurality of turns. In alternative embodiments, the conductive coil may be comprised within an interior of the plasma chamber 208. The inductive coil is configured to generate an electromagnetic field that transfers energy from the RF power supply 214 to gas particles within the plasma chamber 208 to form an inductively coupled plasma. For example, the RF power supply 214 may generate a time-dependent current that produces a time varying magnetic field within the plasma chamber 208, which induces a time-varying electric field that accelerates charged particles to an energy that is sufficient to ionize the gas within the plasma chamber 208 by way of ionizing collisions.

A grid system 112 is arranged between the plasma source 108 and the rotatable stage assembly 202. The grid system 112 is configured to accelerate ions from the plasma 110 towards the rotatable stage assembly 202 as an ion beam 114. In some embodiments, the grid system 112 may comprise a multiple grids. For example, the grid system 112 may comprise a first grid, a second grid, and a third grid. The first grid is in contact with the plasma 110, and may be biased to a positive voltage to define a beam voltage or energy. The second grid may be biased to a negative voltage to accelerate ions from the plasma 110 into the ion beam 114. The third grid is normally grounded and helps reduce divergence of the ion beam 114. In some embodiments, the grid system 112 may comprise one or more grids respectively comprising a sheet of conductive material (e.g., a metal) having a plurality of apertures extending therethrough. In other embodiments, the grid system 112 may comprise one or more grids respectively comprising a plurality of conductive wires or strips extending between various points on an outer conductive ring to define a plurality of apertures.

One or more baffles 120 are arranged along a perimeter of the processing chamber 102. In various embodiments, the one or more baffles 120 may comprise a conductive material, such as a metal (e.g., aluminum, tin, copper, or the like). In other embodiments, the one or more baffles 120 may comprise an insulating material (e.g., a plastic, a ceramic, or the like). The one or more baffles 120 are arranged at a vertical position that is between the rotatable stage assembly 202 and the lower surface 102l of the processing chamber 102. The one or more baffles 120 laterally extend over a part of the lower surface 102l of the processing chamber 102 and are separated from the lower surface 102l of the processing chamber 102 by a non-zero distance. In some embodiments, the one or more baffles 120 may be coupled to sidewalls of the processing chamber 102.

In some embodiments, the one or more baffles 120 may comprise a first lower surface 120a and a second lower surface 120b that is between the first lower surface 120a and the lower surface 102l of the processing chamber 102. The second lower surface 120b is arranged along an outermost edge of the one or more baffles 120. By vertically extending to the second lower surface 120b, the one or more baffles 120 are able to better contain a by-product of an etching process that has been moved directly below the one or more baffles 120 by a by-product redistributor 122.

In some embodiments, the by-product redistributor 122 comprises one or more coolers 218a-218b. The one or more coolers 218a-218b are arranged directly below the one or more baffles 120 and are configured to decrease a temperature below the one or more baffles 120. By decreasing a temperature below the one or more baffles 120, a temperature gradient is formed within the processing chamber 102. The temperature gradient along the bottom of the chamber that decreases in a direction from directly below the one or more baffles to the outside of (i.e., not directly below) the one or more baffles 120. The temperature gradient is configured to move the by-product of the etching process to below the one or more baffles 120 by enhancing diffusion of the by-product of the etching process to below the one or more baffles 120 (e.g., according to a thermophoretic force generated by thermodiffusion). In some embodiments, the temperature gradient may be greater than or equal to approximately 10° C. Such a temperature gradient is sufficient to induce a thermophoretic force to move the by-product of the etching process. In some additional embodiments, the temperature gradient may be in a range of between approximately 10° C. and approximately 50° C.

In some embodiments, the by-product redistributor 122 may further comprise a heater 220 arranged outside of (i.e., not directly below) the one or more baffles 120. For example, the heater 220 may be arranged laterally between the one or more baffles 120 (e.g., in a center of the processing chamber 102). The heater 220 is configured to heat an overlying area of the processing chamber 102, so as to increase the temperature gradient in a direction from directly below the one or more baffles to the outside of the one or more baffles 120 and improve movement of the by-product of the etching process.

In various embodiments, the one or more coolers 218a-218b may comprise pipes configured to transport a cool liquid, a coil (e.g., that moves heat by way of a vapor compression), a thermoelectric heat pump, or the like. In various embodiments, the heater 220 may comprise pipes configured to transport a hot liquid, a coil (e.g., that removes heat by way of a vapor compression), a thermoelectric heat pump, a resistive heater, or the like. In some embodiments, the one or more coolers 218a-218b and/or the heater 220 may be arranged below the lower surface 102l of the processing chamber 102. In other embodiments, the one or more coolers 218a-218b and/or the heater 220 may be arranged within the processing chamber 102. For example, in some embodiments, the one or more coolers 218a-218b and/or the heater 220 may comprise pipes extending into the processing chamber 102, which are configured to carry a heating and/or cooling liquid.

Figure 3:
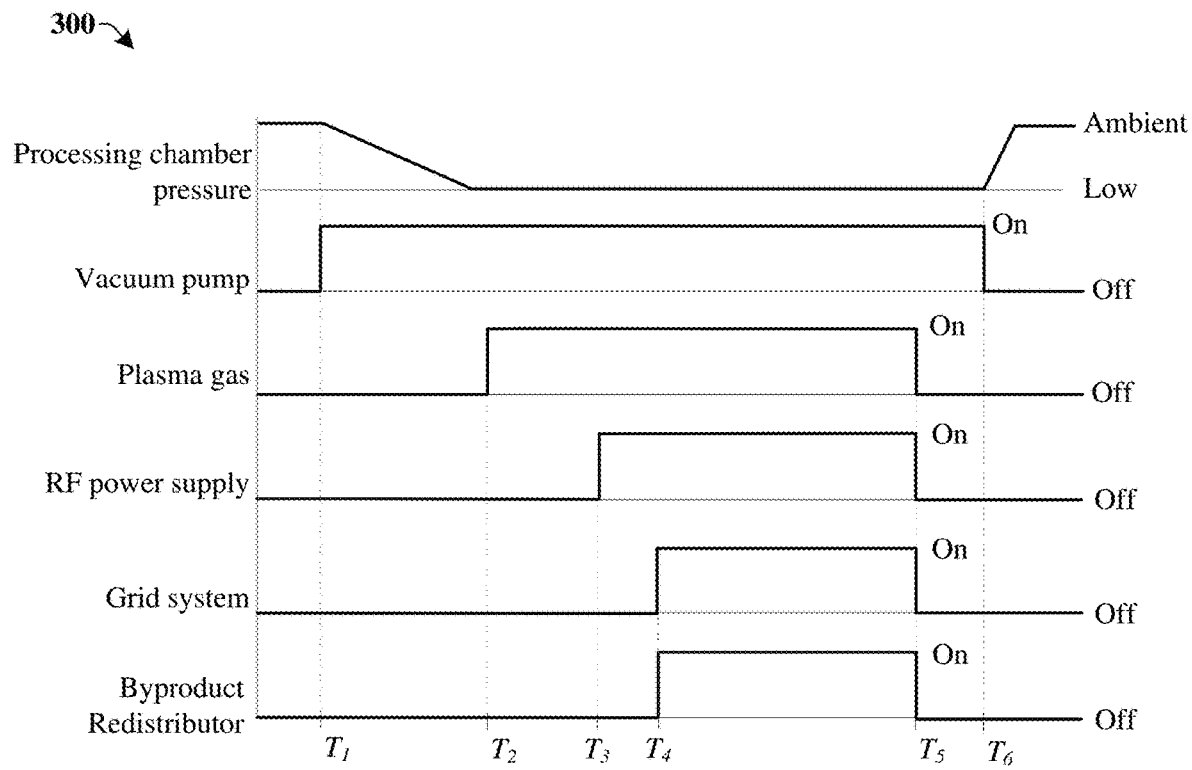
FIG. 3 illustrates some embodiments of a timing diagram showing operation of the ion beam etching apparatus of FIG. 2.

In some embodiments, a control unit 222 may be configured to selectively control operation of one or more of the vacuum pump 116, the first valve 119, the second valve 211, the RF power supply 214, the grid system 112, the one or more coolers 218a-218b, and/or the heater 220. FIG. 3 illustrates a timing diagram 300 showing some embodiments of operation of the control unit 222 on the disclosed ion beam etching apparatus 200 of FIG. 2. It will be appreciated that the operation illustrated in timing diagram 300 is one non-limiting example of operation of the disclosed ion beam etching apparatus 200 and that in other embodiments the operation may be different. Furthermore, the reference numerals included in the description of timing diagram 300 set forth below correspond to FIG. 2 unless otherwise noted.

As shown in timing diagram 300, at a first time $T_1$ the first valve 119 is opened and the vacuum pump 116 is turned on to reduce a pressure within the processing chamber 102. In various embodiments, the vacuum pump 116 may be kept on continuously, kept on intermittently (i.e., turned on and off), or kept off between the first time $T_1$ and a subsequent fifth time $T_5$. At a second time $T_2$, the second valve 211 is opened to introduce a gas into the plasma chamber 208. At a third time $T_3$, the RF power supply 214 is turned on. Turning on the RF power supply 214 causes a plasma 110 to form within the plasma chamber 208. At a fourth time $T_4$ a bias voltage is applied to the grid system 112 so as to accelerate ions from the plasma 110 towards the rotatable stage assembly 202. At a fourth time $T_4$, the by-product redistributor 122 is also operated to move a by-product (e.g., 115 of FIG. 1) of the etching process to below the one or more baffles 120. At a fifth time $T_5$, the etching process is completed. Upon completion of the etching process, the second valve 211 is closed, the RF power supply 214 is turned off, the grid system 112 is turned off, and the by-product redistributor 122 is turned off. At a sixth time $T_6$, the vacuum pump 116 is turned off and the processing chamber 102 is vented. Venting the processing chamber 102 increases a pressure within the processing chamber 102 back to an ambient pressure (i.e., a pressure outside of the processing chamber 102).

Figure 4:
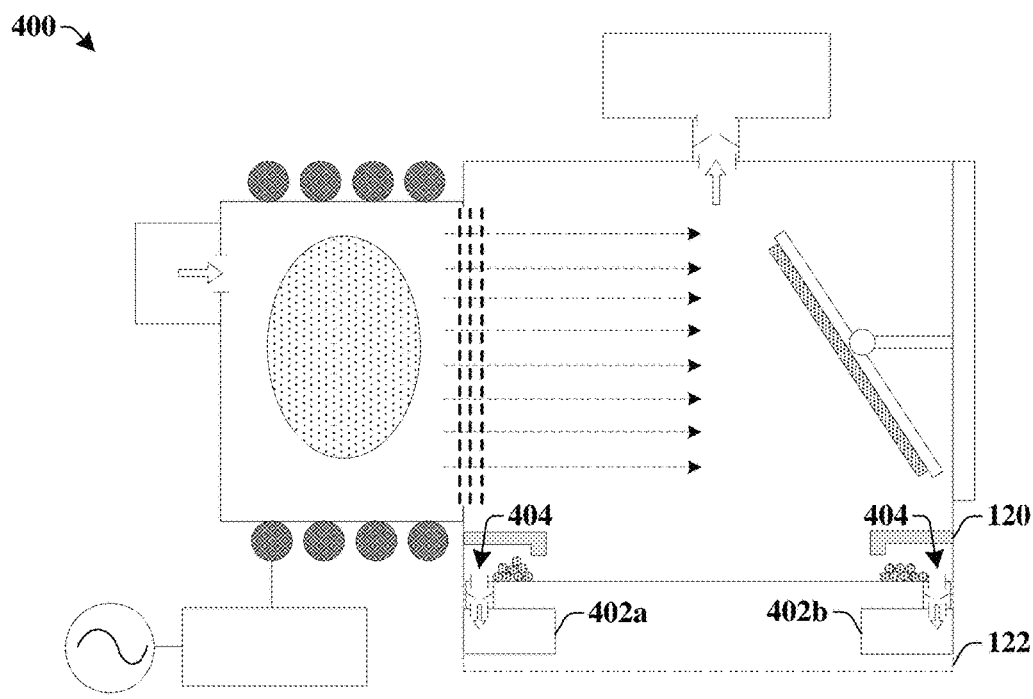
FIG. 4 illustrates a block diagram of some additional embodiments of a disclosed ion beam etching apparatus having one or more baffles.

FIG. 4 illustrates a block diagram of some additional embodiments of a disclosed ion beam etching apparatus 400 having one or more baffles.

The ion beam etching apparatus 400 comprises a by-product redistributor 122 having one or more additional vacuum pumps 402a-402b coupled to a processing chamber 102 by way of one or more additional inlets 404 that are arranged directly below one or more baffles 120. The one or more additional vacuum pumps 402a-402b are configured to generate a pressure gradient along the bottom of the chamber that decreases in a direction from below the one or more baffles to the outside of the one or more baffles 120. The pressure gradient is configured to move the by-product of an etching process from outside of the one or more baffles 120 to below the one or more baffles 120 by acting upon the particles with a force. In some embodiments, the pressure gradient may be greater than or equal to approximately $10^1$ Torr. For example, in some embodiments, the pressure outside of the one or more baffles 120 may be $10^{-5}$ Torr while the pressure below the one or more baffles 120 may be $10^{-6}$ Torr. In other embodiments, the pressure gradient may be less than $10^1$ Torr.

In some embodiments, the one or more baffles 120 may comprise a mobile flap (not shown) that is configured to operate as a valve that keeps the by-product of the etching process directly below the one or more baffles 120. For example, the one or more baffles 120 may comprise a hinge that is coupled to a mobile flap extending below the one or more baffles 120. The lower pressure generated by the one or more additional vacuum pumps 402a-402b will open the mobile flap so as to allow the by-product of the etching process to move below the one or more baffles 120. If the pressure below the mobile flap is increased, it will cause the valve to close thereby trapping the by-product of the etching process below the one or more baffles 120.

Figure 5A:
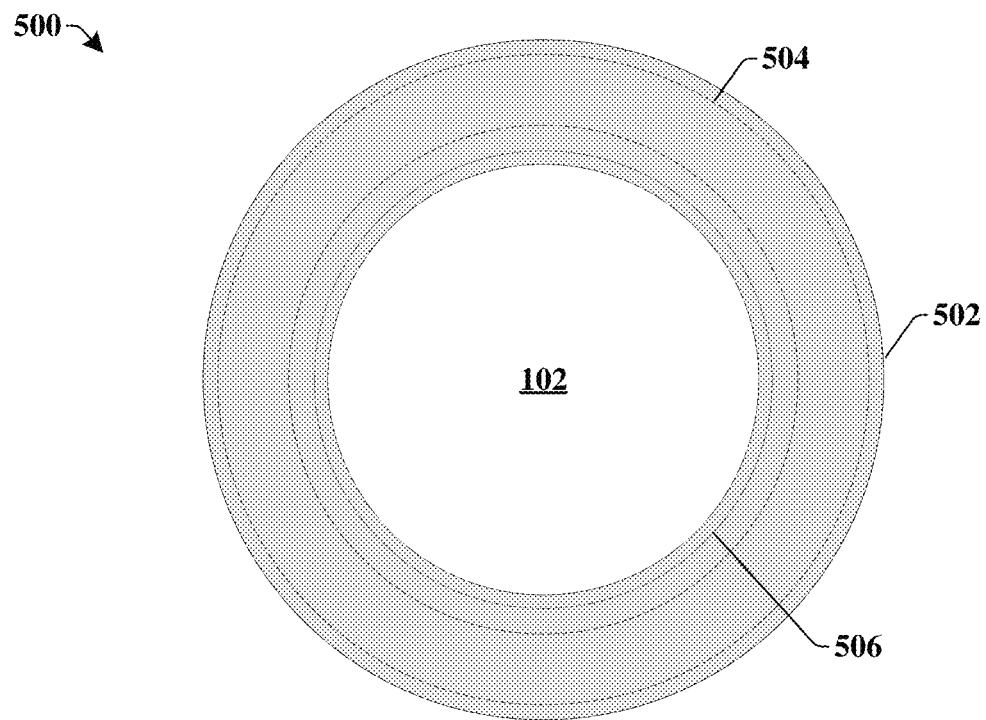
FIGS. 5A-5B illustrates top-views of some embodiments of a disclosed ion beam etching apparatus having one or more baffles.
Figure 5B:
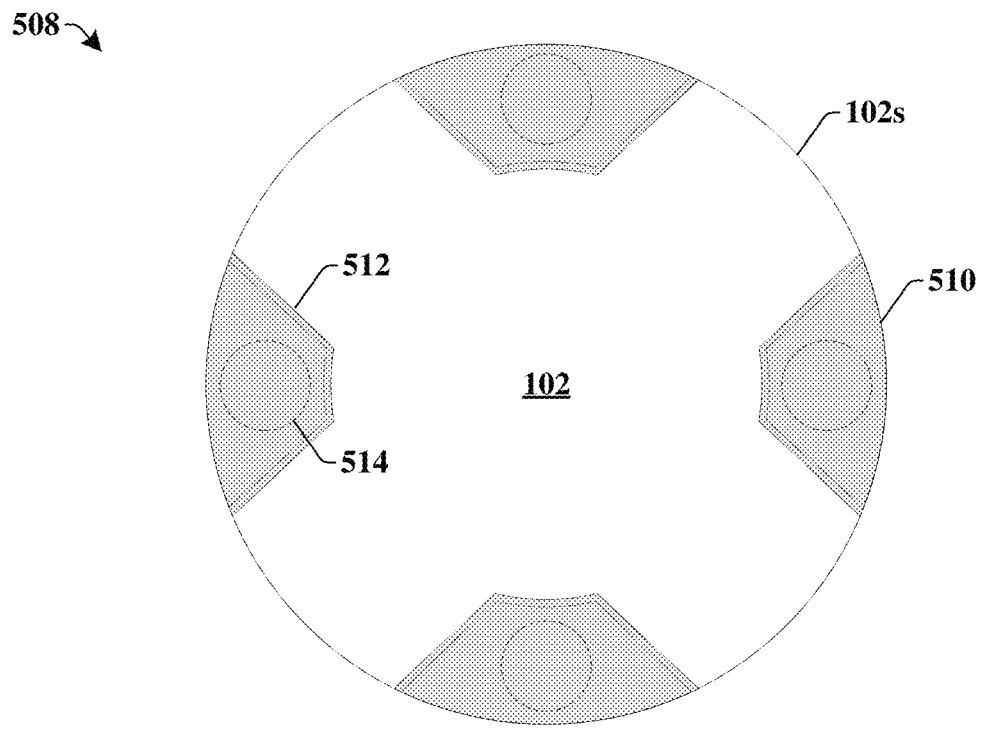

FIGS. 5A-5B illustrates top-views, 500 and 508, of some embodiments of a disclosed ion beam etching apparatus having one or more baffles.

As shown in top-view 500 of FIG. 5A, a single baffle 502 is arranged along an outer perimeter of a processing chamber 102. The single baffle 502 continuously extends around the outer perimeter in an unbroken ring shape over a by-product redistributor 504. In some embodiments, the single baffle 502 may comprise a second lower surface 506 that extends along an edge of the single baffle 502 as an unbroken ring.

In some embodiments, the by-product redistributor 504 may comprise a cooler that continuously extends below the single baffle 502 as an unbroken ring. In other embodiments (not shown), the by-product redistributor may comprise a plurality of coolers may be positioned at separate and discrete locations below the single baffle 502. In some alternative embodiments, the by-product redistributor 504 may comprise an inlet coupled to a vacuum pump, which continuously extends below the single baffle 502 as an unbroken ring. In yet other embodiments (not shown), the by-product redistributor may comprise a plurality of cooling inlets positioned at separate and discrete locations below the single baffle 502 and coupled to one or more vacuum pumps.

As shown in top-view 508 of FIG. 5B, a plurality of baffles 510 are arranged at discrete locations along an outer perimeter of a processing chamber 102. The plurality of baffles 510 are separated from one another by non-zero spaces. In some embodiments, the plurality of baffles 510 respectively comprise a second lower surface 512 that continuously extends between different locations on a sidewall 102s of the processing chamber 102.

In some embodiments, a by-product redistributor 514 may comprise a plurality of coolers respectively disposed below one of the plurality of baffles 510. In some alternative embodiments, the by-product redistributor 514 may comprise a plurality of inlets respectively arranged below one of the plurality of baffles 510 and coupled to a vacuum pump.

In various embodiments, the disclosed baffles may have different shapes. FIGS. 6A-6D illustrates cross-sectional views of some embodiments of baffles disclosed herein. It will be appreciated that the shapes of the baffles illustrated in FIGS. 6A-6D are non-limiting examples of the shapes of the baffles and that the disclosed baffles may have other shapes in some additional embodiments.

Figure 6A:
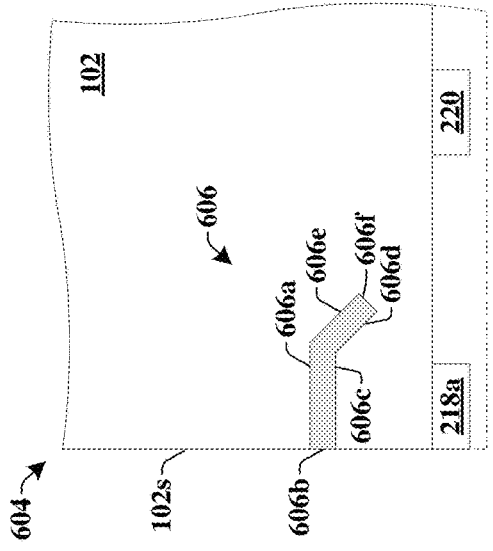
FIGS. 6A-6D illustrates cross-sectional views of some embodiments of one or more baffles as provided herein.

FIG. 6A illustrates a cross-sectional view 600 of some embodiments of a disclosed baffle 602. The disclosed baffle 602 comprises an "L" shaped structure that has an upper surface 602a that is parallel to a lower surface 102l of a processing chamber 102. The upper surface 602a is coupled to a first vertical sidewall 602b and a second vertical sidewall 602c that are perpendicular to the lower surface 102l of the processing chamber 102. The first vertical sidewall 602b contacts a sidewall 102s of the processing chamber 102 and is coupled to a first lower surface 602d. The second vertical sidewall 602c is coupled to a second lower surface 602e that is between the first lower surface 602d and the lower surface 102l of the processing chamber 102.

Figure 6B:
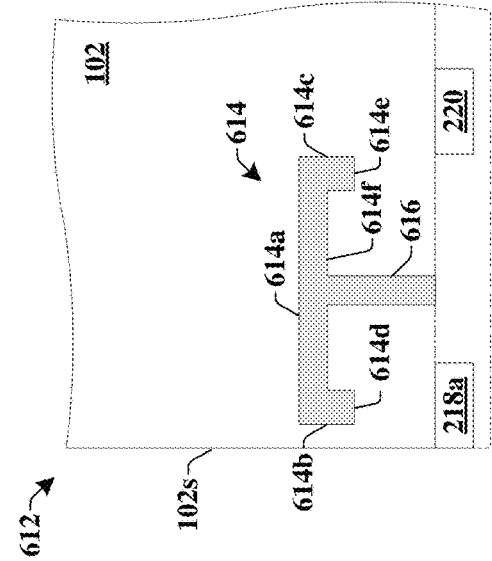

FIG. 6B illustrates a cross-sectional view 604 of some alternative embodiments of a disclosed baffle 606. The disclosed baffle 606 comprises an upper surface 606a that is parallel to a lower surface 102l of a processing chamber 102. The upper surface 606a is coupled to a first vertical sidewall 606b that contacts a sidewall 102s of the processing chamber 102. The first vertical sidewall 606b is further coupled to a first lower surface 606c that is further coupled to a first angled surface 606d. The upper surface 606a is further coupled to a second angled surface 606e that is coupled to a second lower surface 606f that is between the first angled surface 606d and the second angled surface 606e.

Figure 6C:
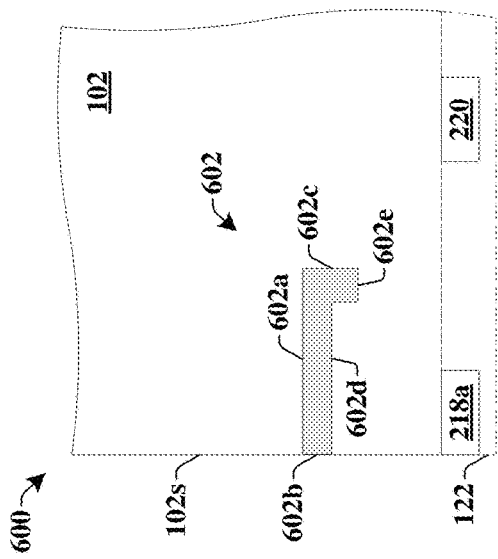

FIG. 6C illustrates a cross-sectional view 608 of some alternative embodiments of a disclosed baffle 610. The disclosed baffle 610 comprises an upper surface 610a that is coupled to a first vertical sidewall 610b that contacts a sidewall 102s of a processing chamber 102. The first vertical sidewall 610b is further coupled to a first lower surface 610d. The upper surface 606a is coupled to a second lower surface 610f by way of a first curved surface 610c. The first lower surface 610d is coupled to the second lower surface 610f by way of a second curved surface 610e. The second lower surface 610f is between the first lower surface 610d and the lower surface 102l of the processing chamber 102.

Figure 6D:
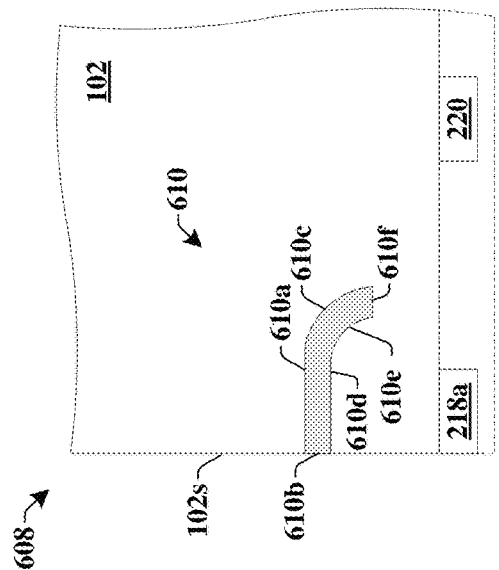

FIG. 6D illustrates a cross-sectional view 612 of some embodiments of a disclosed baffle 614. The disclosed baffle 614 comprises an upper surface 614a that is parallel to a lower surface 102l of a processing chamber 102. The upper surface 614a is coupled to a first vertical sidewall 614b and a second vertical sidewall 614c that are perpendicular to the lower surface 102l of the processing chamber 102. The first vertical sidewall 614b is separated from a sidewall 102s of the processing chamber 102 and is coupled to a first lower surface 614d. The second vertical sidewall 614c is separated from a sidewall 102s of the processing chamber 102 and is coupled to a second lower surface 614e. A third lower surface 614f is arranged laterally between the first lower surface 614d and the second lower surface 614e. The third lower surface 614f is coupled to a support structure 616 that connects the third lower surface 614f to the lower surface 102l of the processing chamber 102.

FIGS. 7-10 illustrate cross-sectional views 700-1000 of some embodiments of a method of performing an ion beam etching process. Although the cross-sectional views 700-1000 shown in FIGS. 7-10 are described with reference to a method, it will be appreciated that the structures shown in FIGS. 7-10 are not limited to the method but rather may stand alone separate of the method.

Figure 7:
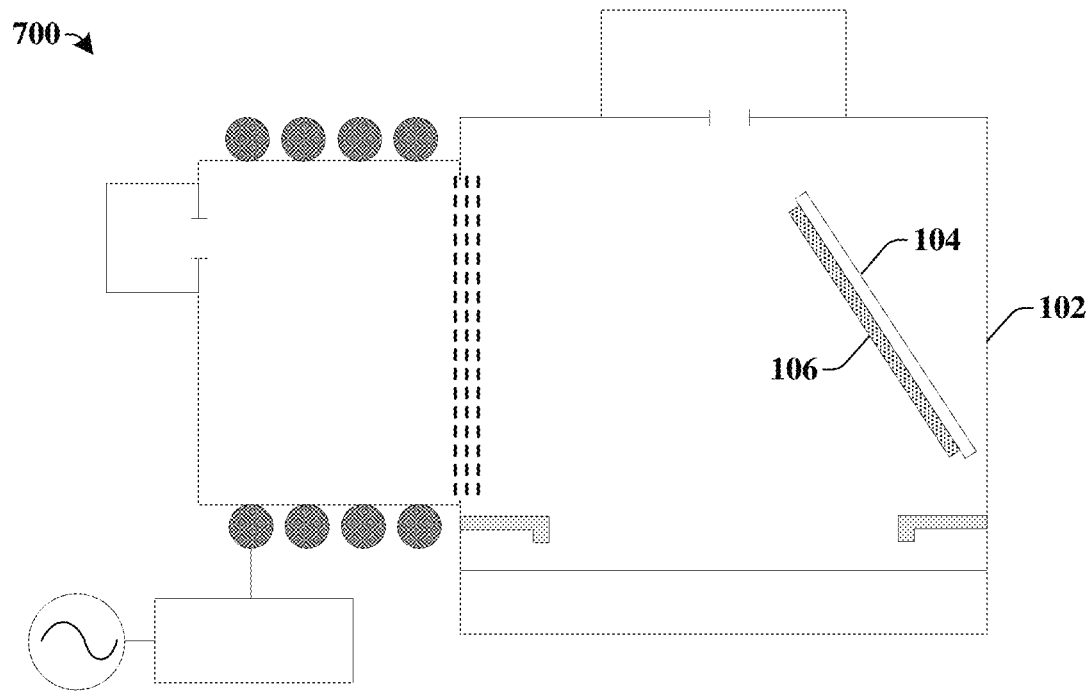
FIGS. 7-10 illustrate cross-sectional views of some embodiments of a method of performing an ion beam etching process.

As shown in cross-sectional view 700 of FIG. 7, a workpiece 106 is loaded onto a substrate holder 104 within a processing chamber 102. In some embodiments, the workpiece 106 may comprise a semiconductor substrate. In various embodiments, the semiconductor substrate may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. In some embodiments, the workpiece 106 may comprise an exposed ceramic material (e.g., a piezoelectric material) that is to be etched.

Figure 8:
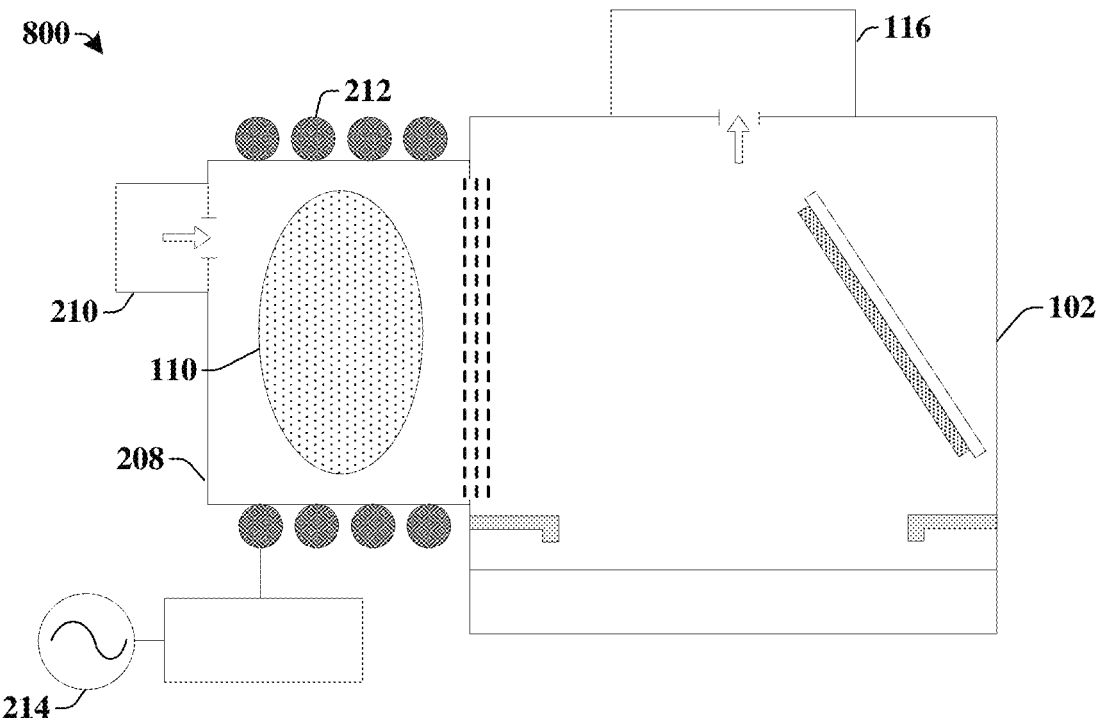

As shown in cross-sectional view 800 of FIG. 8, the processing chamber 102 is pumped down to maintain a relatively low pressure within the processing chamber 102. For example, the processing chamber 102 may be pumped down to a pressure that is in a range of between approximately $10^{-5}$ Torr and approximately $10^{-6}$ Torr. In some embodiments, the processing chamber 102 may be pumped down by operating a vacuum pump 116 to decrease a pressure of the processing chamber 102.

After the processing chamber 102 is pumped down, a plasma 110 is generated within a plasma chamber 208 that is coupled to the processing chamber 102. In some embodiments, the plasma 110 may be generated by introducing a gas (e.g., Argon) from a gas source 210 into the plasma chamber 208. An RF power supply 214 is subsequently operated to apply an RF signal to an RF antenna 212 in communication with the plasma chamber 208. The RF signal is configured to generate an electromagnetic field that transfers energy to particles of the gas within the plasma chamber 208 to form an inductively coupled plasma (ICP). In some embodiments, the introducing the gas from the gas source 210 into the plasma chamber 208 may increase a pressure of the processing chamber 102 to a pressure of approximately $10^{-4}$ Torr while the gas is flowing.

Figure 9:
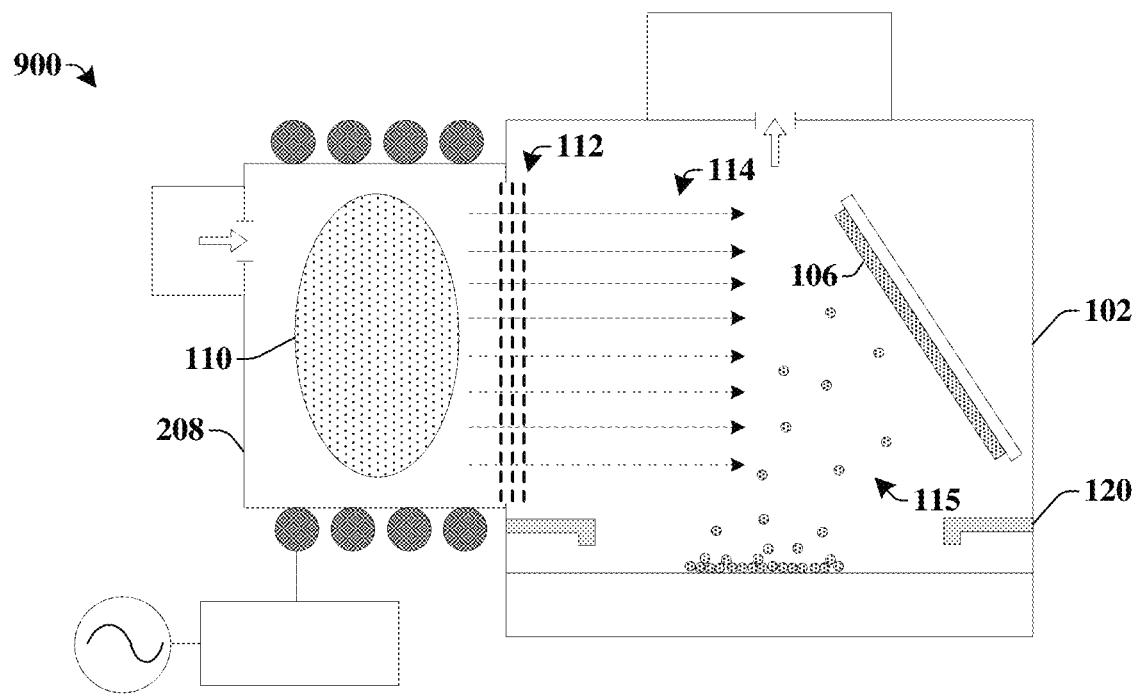

As shown in cross-sectional view 900 of FIG. 9, ions from the plasma 110 are accelerated towards the workpiece 106 within the plasma chamber 208 as an ion beam 114 that is configured to perform an etching process on the workpiece 106. In some embodiments, the ions from the plasma are accelerated by applying one or more bias voltages to a grid system 112 disposed between the plasma 110 and the workpiece 106. The one or more bias voltages generate an electromagnetic field that acts to accelerate ions within the plasma 110. The accelerated ions pass through apertures within the grid system 112 to form the ion beam 114.

The ion beam 114 strikes the workpiece 106. Ions with sufficient energy dislodge atoms from the workpiece 106, so as to etch the workpiece 106. A by-product of the etching process 115 falls to a lower surface 102l of the processing chamber 102 between one or more baffles 120.

Figure 10:
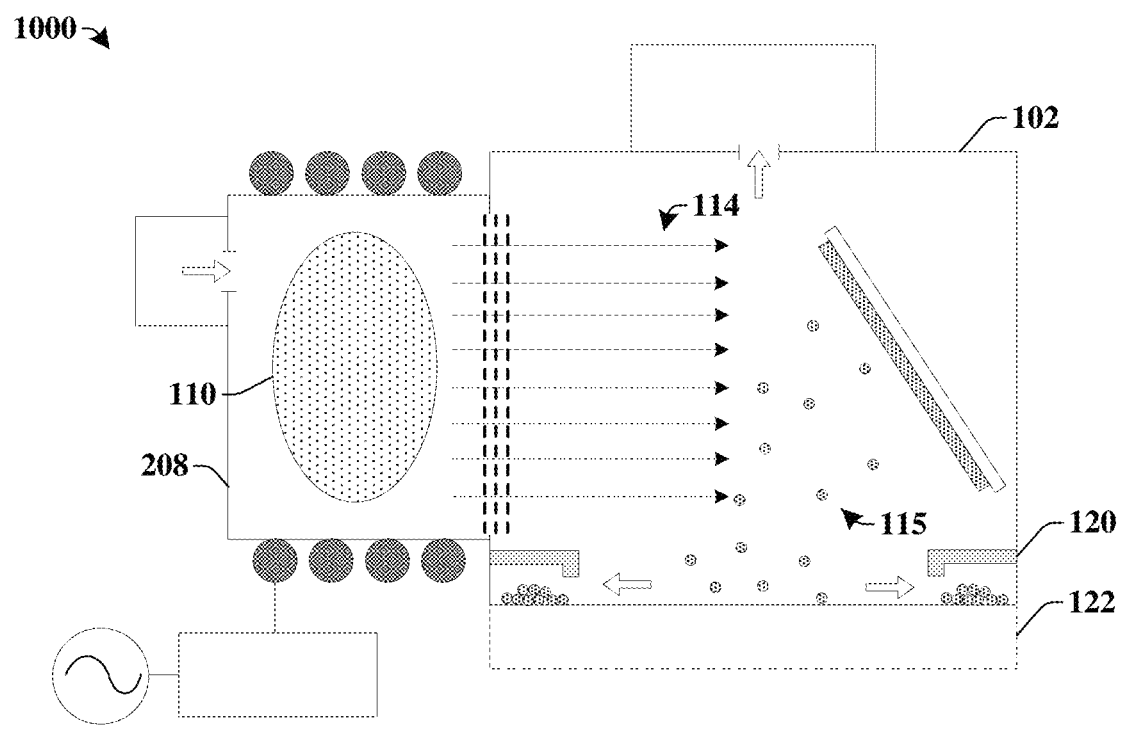

As shown in cross-sectional view 1000 of FIG. 10, the by-product from the etching process 115 is moved from outside of (i.e., not directly below) the one or more baffles 120 to directly below one or more baffles 120. In various embodiments, the by-product from the etching process 115 may be moved to directly below the one or more baffles 120 concurrent to the etching process and/or after the etching process is completed.

In some embodiments, the by-product 115 of the etching process may be moved by generating a temperature gradient along the bottom of the chamber that decreases in a direction from directly below the one or more baffles to the outside of (i.e., not directly below) the one or more baffles 120. The temperature gradient is configured to move the by-product of the etching process to below the one or more baffles 120 by enhancing diffusion of the by-product of the etching process to below the one or more baffles. In other embodiments, the by-product 115 of the etching process may be moved by generating a pressure gradient along the bottom of the chamber that decreases in a direction from below the one or more baffles to the outside of (i.e., not directly below) the one or more baffles 120.

FIG. 11 illustrates a flow diagram of some embodiments of a method 1100 of forming an integrated chip having an embedded flash memory device with an enhanced floating gate.

While method 1100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1102, a workpiece is loaded into a processing chamber. FIG. 7 illustrates a cross-sectional view 700 of some embodiments corresponding to act 1102.

At 1104, the processing chamber is pumped down to reduce a pressure within the processing chamber from an ambient pressure to a low pressure (i.e., a high vacuum). FIG. 8 illustrates a cross-sectional view 800 of some embodiments corresponding to act 1104.

At 1106, a gas is introduced into a plasma chamber that is in communication with the processing chamber. FIG. 8 illustrates a cross-sectional view 800 of some embodiments corresponding to act 1106.

At 1108, a plasma is generated within the plasma chamber from the gas. FIG. 8 illustrates a cross-sectional view 800 of some embodiments corresponding to act 1108.

At 1110, ions from the plasma are accelerated towards a workpiece within the plasma chamber so as to etch the workpiece within the plasma chamber. FIG. 9 illustrates a cross-sectional view 900 of some embodiments corresponding to act 1110.

At 1112, a by-product from the etching process is moved directly below one or more baffles within the processing chamber. FIG. 10 illustrates a cross-sectional view 900 of some embodiments corresponding to act 1112.

In some embodiments, the by-product from the etching process may be moved directly below the one or more baffles by generating a temperature gradient within the processing chamber, at 1114. The temperature gradient along the bottom of the chamber that decreases in a direction from directly below the one or more baffles to the outside of the one or more baffles 120.

In other embodiments, the by-product from the etching process may be moved directly below the one or more baffles by generating a pressure gradient within the processing chamber, at 1116. The pressure gradient along the bottom of the chamber that decreases in a direction from directly below the one or more baffles to the outside of (i.e., not directly below) the one or more baffles 120.

At 1118, the processing chamber is vented to increase a pressure of the processing chamber from the low pressure (i.e., the high vacuum) to an ambient pressure. Venting the processing chamber causes gases within the processing chamber to become turbulent. However, because the by-product from the etching process has been moved directly below the one or more baffles, a subsequent re-deposition of the by-product of the etching process onto the workpiece by the turbulent gases generated during venting is mitigated.

It will be appreciated that the disclosed ion beam etching apparatus and associated process that is described herein may comprise any type of dry etching apparatus, and in various embodiments may be configured to perform reactive ion beam etching, sputter etching/ion milling, plasma etching, barrel etching, or the like.

Accordingly, in some embodiments, the present disclosure relates to an ion beam etching apparatus that has a by-product redistributor configured to move a by-product from an etching process to directly below one or more baffles, so as to reduce re-deposition of an etching by-product onto a workpiece.

In some embodiments, the present disclosure relates to an ion beam etching apparatus. The etching apparatus includes a substrate holder disposed within a processing chamber; a plasma source in communication with the processing chamber; a vacuum pump coupled to the processing chamber by way of an inlet; one or more baffles arranged between the substrate holder and a lower surface of the processing chamber; and a by-product redistributor configured to move a by-product from an etching process from outside of the one or more baffles to directly below the one or more baffles. In some embodiments, the one or more baffles include sidewalls that are separated by a space that is directly below the substrate holder. In some embodiments, the one or more baffles are coupled to a sidewall of the processing chamber. In some embodiments, the one or more baffles include a first lower surface and a second lower surface that is between the first lower surface and the lower surface of the processing chamber, the second lower surface arranged along an outermost edge of the one or more baffles. In some embodiments, the by-product redistributor includes a heater arranged outside of the one or more baffles; and a cooler arranged directly below the one or more baffles, the heater and the cooler configured to generate a temperature gradient along the bottom of the chamber that decreases in a direction from directly below the one or more baffles to the outside of the one or more baffles 120. In some embodiments, the temperature gradient is greater than or equal to approximately 10° C. In some embodiments, the heater and the cooler are arranged below the lower surface of the processing chamber. In some embodiments, the by-product redistributor includes one or more additional vacuum pumps coupled to the processing chamber by way of one or more additional inlets that are arranged directly below the one or more baffles, the one or more additional vacuum pumps configured to generate a pressure gradient along the bottom of the chamber that decreases in a direction from directly below the one or more baffles to the outside of the one or more baffles 120. In some embodiments, the one or more baffles include a baffle that continuously extends around a perimeter of the processing chamber.

In other embodiments, the present disclosure relates to an etching apparatus. The etching apparatus includes a substrate holder disposed within a processing chamber and having a workpiece reception area configured to hold a workpiece; a vacuum pump coupled to the processing chamber by way of an inlet; one or more baffles extending outward from a sidewall of the processing chamber at vertical positions between the substrate holder and a lower surface of the processing chamber; and a by-product redistributor configured to move a by-product from an etching process to directly below the one or more baffles. In some embodiments, the etching apparatus further includes a plasma source configured to generate a plasma; and a grid system configured to accelerate ions from the plasma towards the substrate holder as an ion beam. In some embodiments, the by-product redistributor includes a cooler arranged directly below the one or more baffles, the cooler configured to generate a temperature gradient along the bottom of the chamber that decreases in a direction from directly below the one or more baffles to the outside of the one or more baffles 120. In some embodiments, the by-product redistributor further includes a heater arranged outside of the one or more baffles. In some embodiments, the by-product redistributor includes one or more additional vacuum pumps coupled to the processing chamber by way of one or more additional inlets that are arranged directly below the one or more baffles, the one or more additional vacuum pumps configured to generate a pressure gradient along the bottom of the chamber that decreases in a direction from directly below the one or more baffles to the outside of the one or more baffles 120. In some embodiments, the one or more baffles include a first lower surface and a second lower surface that is between the first lower surface and the lower surface of the processing chamber; and the second lower surface is arranged along an outermost edge of the one or more baffles. In some embodiments, the one or more baffles include a single baffle coupled to the sidewall of the processing chamber and extending continuously around a perimeter of the processing chamber as an unbroken ring.

In yet other embodiments, the present disclosure relates to a method of performing an etching process. The method includes generating a plasma within a plasma chamber in communication with a processing chamber; accelerating ions from the plasma toward a workpiece within the processing chamber to generate an ion beam, the ion beam performs an etching process that etches a material on the workpiece; and moving a by-product from the etching process to directly below one or more baffles within the processing chamber. In some embodiments, moving the by-product from the etching process to below the one or more baffles includes generating a temperature gradient within the processing chamber decreasing in a direction from directly below the one or more baffles at a first temperature to the outside of the one or more baffles at a higher second temperature. In some embodiments, moving the by-product from the etching process to below the one or more baffles includes generating a pressure gradient within the processing chamber decreasing in a direction from directly below the one or more baffles at a first pressure to the outside of the one or more baffles at a higher second pressure. In some embodiments, the method further includes introducing a gas into the plasma chamber, the plasma is generated from the gas within the plasma chamber; and venting the processing chamber upon completion of the etching process and after moving the by-product from the etching process to directly below the one or more baffles.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An etching apparatus, comprising:
   a substrate holder disposed within a processing chamber and comprising a workpiece reception surface that is configured to hold a workpiece and that faces a lower surface of the processing chamber, wherein the lower surface of the processing chamber has a first region that is directly below the workpiece reception surface and that is configured to receive a by-product from an etching process;
   a baffle extending outward from a sidewall of the processing chamber at a vertical position between the substrate holder and the lower surface of the processing chamber, wherein the baffle is separated from the lower surface of the processing chamber and wherein the workpiece reception surface faces the baffle;
   a plasma source configured to form an ion beam, wherein the ion beam extends along a line from the plasma source, to directly over the baffle, and to intersect the workpiece reception surface directly above the first region;
   a vacuum inlet arranged along an interior surface of the processing chamber that is above the baffle, wherein the vacuum inlet is coupled to a vacuum pump; and
   a by-product redistributor configured to move the by-product from the first region of the lower surface to a second region of the lower surface directly below the baffle, wherein the by-product redistributor comprises an additional vacuum inlet disposed below the baffle.

2. The etching apparatus of claim 1, wherein the baffle comprises an uppermost surface that continuously extends between outermost sidewalls of the baffle as viewed along a cross-section of the baffle, the uppermost surface intersecting the sidewall of the processing chamber and being perpendicular to the sidewall of the processing chamber.

3. The etching apparatus of claim 1, wherein the baffle is separated from the lower surface of the processing chamber by a space, the space laterally between the baffle and a center of the lower surface.

4. The etching apparatus of claim 1, wherein the by-product redistributor is configured to move the by-product laterally along the lower surface from directly below the substrate holder to directly below the baffle.

5. The etching apparatus of claim 1, wherein the etching apparatus is configured to turn on the by-product redistributor after turning on the plasma source to generate the ion beam.

6. An etching apparatus, comprising:
   a substrate holder disposed within a processing chamber and comprising a surface that is configured to hold a workpiece and that faces a bottommost interior surface of the processing chamber, wherein the bottommost interior surface of the processing chamber is a flat surface that has a first region that is directly below the substrate holder and that is configured to receive a by-product from an etching process;
   baffles extending outward from opposing sidewalls of the processing chamber at a vertical position between the substrate holder and the bottommost interior surface of the processing chamber, as viewed in cross-section, wherein outermost sidewalls of the baffles that face one another are separated by a space, a region of the space that is directly below the substrate holder also being laterally and directly between the outermost sidewalls of the baffles; and
   a by-product redistributor configured to move the by-product from the first region of the bottommost interior surface to a second region of the bottommost interior surface directly below the baffles,
   wherein the by-product redistributor comprises: a heater arranged entirely and directly below a central region of the bottommost interior surface of the processing chamber; and one or more coolers arranged entirely and directly below both the baffles and peripheral regions of the bottommost interior surface of the processing chamber.

7. The etching apparatus of claim 6, wherein the baffles are directly and vertically between a bottommost surface of the substrate holder and the bottommost interior surface of the processing chamber.

8. The etching apparatus of claim 6, wherein the baffles respectively have a vertically extending portion and a horizontally extending portion, the vertically extending portion being directly below a topmost surface of the baffles.

9. The etching apparatus of claim 6, wherein the baffles discontinuously extend along an outer perimeter of the processing chamber as viewed in a top-view.

10. The etching apparatus of claim 6, wherein the one or more coolers are separated from the baffles by the bottommost interior surface.

11. The etching apparatus of claim 6, wherein the baffles comprise a baffle that has a topmost surface that is directly coupled to a sidewall of the baffle, an entirety of the sidewall of the baffle physically contacting the sidewall of the processing chamber, wherein the topmost surface of the baffle continuously extends from directly below the substrate holder to laterally outside of the substrate holder.

12. The etching apparatus of claim 6, further comprising:
   a vacuum inlet arranged along an interior surface of the processing chamber that is above the baffles, wherein the vacuum inlet is coupled to a vacuum pump.

13. The etching apparatus of claim 6, wherein the baffles are respectively directly between the one or more coolers and the substrate holder.

14. The etching apparatus of claim 6, wherein the baffles are respectively directly above the one or more coolers and the substrate holder is directly above the baffles.

15. The etching apparatus of claim 6, wherein the heater is at least partially laterally outside of the substrate holder.

16. An etching apparatus, comprising:
   a substrate holder disposed within a processing chamber and comprising a workpiece reception surface that is configured to hold a workpiece and that faces a lower surface of the processing chamber, wherein the lower surface of the processing chamber has a first region that is directly below the substrate holder;
   one or more baffles extending outward from opposing sidewalls of the processing chamber and respectively having an outermost sidewall that is at a vertical height between a bottommost surface of the substrate holder that faces the lower surface of the processing chamber and the lower surface of the processing chamber;

a plasma source configured to form an ion beam that extends in a direction that is parallel to a top surface of the one or more baffles towards the workpiece reception surface;

a by-product redistributor disposed below the one or more baffles and configured to laterally move a by-product from an etching process along the lower surface from the first region of the lower surface that is outside of the one or more baffles to a second region of the lower surface that is directly below the one or more baffles; and a vacuum inlet arranged along an interior surface of the processing chamber that is above the one or more baffles, wherein the vacuum inlet is coupled to a vacuum pump.

17. The etching apparatus of claim 16, wherein the one or more baffles comprise a protrusion extending outward from a lower surface of the one or more baffles that faces a bottom of the processing chamber, the protrusion extending to a bottommost surface of the one or more baffles that is separated from the lower surface of the processing chamber by a non-zero distance.

18. The etching apparatus of claim 16, wherein the etching apparatus is configured to turn on the by-product redistributor after turning on the plasma source to generate the ion beam.

19. The etching apparatus of claim 16, wherein the by-product redistributor continuously extends in a closed loop around a central region of the processing chamber.

20. The etching apparatus of claim 16, wherein the by-product redistributor comprises a heater and one or more coolers arranged entirely and directly below a bottommost interior surface of the processing chamber, the one or more coolers laterally surrounding the heater.

* * * * *